(12) United States Patent
Shimizu

(10) Patent No.: US 6,440,615 B1
(45) Date of Patent: Aug. 27, 2002

(54) METHOD OF REPAIRING A MASK WITH HIGH ELECTRON SCATTERING AND LOW ELECTRON ABSORPTION PROPERTIES

(75) Inventor: Sumito Shimizu, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/500,560

(22) Filed: Feb. 9, 2000

(30) Foreign Application Priority Data

| Feb. 9, 1999 | (JP) | ................................... 11-031024 |
| Feb. 9, 1999 | (JP) | ................................... 11-031025 |
| Feb. 9, 1999 | (JP) | ................................... 11-031026 |
| Feb. 9, 1999 | (JP) | ................................... 11-031027 |

(51) Int. Cl.[7] .................................................. G03F 9/00
(52) U.S. Cl. ......................................................... 430/5
(58) Field of Search ............................. 430/5; 216/63, 216/67; 427/255.28

(56) References Cited

U.S. PATENT DOCUMENTS 5,876,881 A * 3/1999 Kawata ............................ 430/5

OTHER PUBLICATIONS

Gamo and Namba, "Ion Beam Assisted Etching and Deposition," *J. Vac. Sci. Technol.* B 8 (6) (Nov./Dec. 1990), 1927–31.

Harriott, "Focused–Ion–Beam–Induced Gas Etching," *Jpn. J. Appl. Phys.* 33 (1994), 7094–8.

* cited by examiner

*Primary Examiner*—S. Rosasco
(74) *Attorney, Agent, or Firm*—Chapman and Cutler

(57) ABSTRACT

A method to repair a scattering stencil type mask having a high electron beam scattering property and low electron absorption. In order to correct a defect caused at the time of manufacturing of the mask, which is being used when a reduction projection image is transferred onto a substrate and has a pattern projection portion comprising an electron beam scattering material, a repair membrane is formed in the defective portion of the mask by irradiating a charged particle beam to said defect while a gas including substances having high scattering properties are supplied to the close vicinity of the defective portion.

19 Claims, 6 Drawing Sheets

METHOD OF REPAIRING A MASK WITH HIGH ELECTRON SCATTERING AND LOW ELECTRON ABSORPTION PROPERTIES

BACKGROUND OF THE INVENTION

1. Field of the Invention

The present invention relates to a method of repair a scattering stencil type mask utilized in the electron-beam projection lithography systems.

2. Description of the Related Art

In manufacture of semiconductor elements such as IC and LSI, a lithography process is used to create fine circuit patterns on a semiconductor substrate. The performance of the semiconductor elements is mostly determined by the number of circuits provided in each element, which significantly dependent on the size of patterns of circuits. The recent developments in semiconductor integrated circuit production technology have been remarkable, and show a strong tendency toward miniaturization and further integration. As a method of forming an integrated circuit pattern on semiconductor substrates, a lithography method utilizing ultraviolet light is commonly used.

However, with the further miniaturization of the circuit pattern, it has been a concern that the resolution of the light is approaching its limit. Thus, the high-resolution lithography technology using a charged particle beam such as electron beam and ion beam, or X-ray is being examined. For example, since exposure technology utilizing a charged particle beam can make the beam diameter to be as small as order of nm, it is characterized by that a miniaturized pattern below 100 nm can be easily formed, and an electron beam writing technology has been known for a long time. However, in so-called direct-writing method where the writing is performed by scanning very fine electron beam, it takes a very long time to form a large-area or large-size pattern, that is, the throughput (a processing rate per unit time) is low. For that reason, a photolithography method where the light source is ultraviolet light is still being used as the lithography method of manufacturing the semiconductor integrated circuits, while the electron beam direct-writing method is used only in limited fields such as in manufacturing of reticles, or masks, for use with photolithography and trial manufacturing of devices for the purpose of experimentation.

Then, in order to solve such a problem, lithography technology EBPS (Electron Beam Projection System) is proposed, in which, instead of a direct writing by a charged particle, a predetermined reticle pattern is transferred by reduction-projection on a wafer by means of an electron optical system.

For example, Jpn. J. Appl. Phys. 34 (1995), page 6658, explains the electron beam lithography technology in terms of its development from the direct writing method using an electron beam as a projection light source, to a method of projection exposure with variable axis immersion lenses.

As a reticle used in the EBPS, it seems that a scattering stencil type thereof is desirable in light of the exposure characteristics. The scattering stencil type includes a pattern portion to be exposed which consists of voids or openings and a supporting structure, membrane. The method for forming a scattering stencil type reticle is such that an oxide film is formed on a silicon substrate and then a predetermined pattern is formed on this oxide film. The silicon substrate is then etched in accordance with this pattern.

For this scattering stencil type reticle, a pattern defect is always caused at the time of forming the reticle. Namely, there are occasions where the material is absent in the necessary electron beam scattering material pattern (clear defect), or an extra material is occurred due to an additional amount of electron beam scattering material (opaque defect). In general, it is considered that the clear pattern is caused by an error made at the time when the pattern is projected onto a membrane (at the time of the resist-pattern writing), so that the portion where the resist pattern is missing becomes itself a clear defect. On the other hand, a opaque defect is the electron beam scattering material which has remained in unwanted areas due to the fact that such foreign materials or the like, for example one that could become an etching mask, adheres to the resist pattern.

As a method which repairs a opaque defect, it is possible to undertake selective milling by irradiating a charged particle beam such as a focused ion beam so as to perform pattern correction thereof. However, there is a problem that after the milling is once performed the material adheres again to a portion of the pattern. Since this portion with adhered material might become a opaque defect depending on the size thereof, this portion will have to be pattern-corrected at a later stage. Thus an etching method is needed by which the material adhered can be suppressed as much as possible.

A gas-assist etching is suggested as a method, which solves the problem of material adhertion as described above. The gas-assist etching is a method in which the etching is performed using a focused ion beam, while material to be etched and gas which is liable to chemically react are supplied at a suitable level thereof in the vicinity of the portion to be etched. Though this etching can suppress the material adhered to a certain degree; it does not suppress it completely. Moreover, though the gas to be supplied has a low etching capacity, the gas corrodes the material to be etched. Thus it is difficult to appropriately control the shape of a cross section of a portion to be processed.

Since these defects in the reticles also occur in photomasks for use in ultraviolet light exposure, a reticle repair device is used for correcting the defects of photomasks. In this reticle repair device, the opaque defect is corrected using an ion beam etching method, by locally removing the chrome serving as a shielding material. A clear defect is corrected using the method of Focused Ion Beam (FIB)-Induced Deposition using a focused ion beam, by locally coating a carbon film. Moreover, it is considered reasonable that when a mask is used in the X-ray equi-multiple exposure method, or EUV lithography, which is in the course of being developed both opaque defect repair and clear defect repair can be accomplished by a focused ion beam.

In a scattering stencil type reticle used in electron beam reduction projection lithography with an electron beam serving as an exposure source, we are faced with the following new problems, which do not exist in the conventional reticles:

(1) Since the reduction projection lithography method using an electron beam concerns a technology forming a pattern of less than 0.1 $\mu$m, it is necessary to form an electron scattering material pattern of less than 0.4 $\mu$m on the reticle in the event that the reduction factor is one forth. On the other hand, as the electron beam scattering material requires a thickness of approximately 2 $\mu$m, the aspect ratio of the electron beam scattering material pattern is approximately 5. Since severe specification is required for the size of a portion to be processed in a reticle and a cross sectional shape thereof, the miniaturization processing for the reticle requires an advanced processing technique as the aspect ratio increases, thus its processing becomes excessively difficult to carry out.

(2) The reticle, or mask, used in reduction projection lithography using an electron beam is constituted by the electron beam scattering material alone, and is of so-called scattering stencil type. Namely, in this scattering stencil type mask, a pattern of an electron beam scattering material is not formed on the substrate which is illuminated by the electron beam, instead, the region which is illuminated by the electron beam is opened, so that the projected pattern is formed and consists of the electron beam scattering material alone. In scattering stencil reticle, incident beam is usually absorbed by the membrane or substrate but can pass through void, aperture, opening which forms a pattern. In scattering stencil reticle, incident beam is scattered by the membrane or substrate but can pass through void, aperture, opening which form pattern to be projected. In scattering membrane reticle, incident beam is scattered by the scatterer on the reticle surface, which forms pattern to be projected and almost pass through membrane. In a case where the electron beam scattering material is formed on a substrate, to form the film of the electron beam scattering material selectively for the purpose of correcting a clear defect is relatively easy. However, for the scattering stencil type reticle, which does not require the substrate, the electron beam scattering material must be accumulated in the horizontal direction from the clear defect so that the clear defect can be modified. A method of modifying a clear defect of a scattering stencil type reticle has not been established in the prior art.

(3) With conventional repair method using FIB, the inclination of repaired wall or side face is 86° to 87°. But for EBPS using scattering stencil mask, the inclination of the wall or side face of void, or opening, or aperture should be within 90°±1°.

(4) For repair of clear defects, suitable materials, which scatter electrons as the membrane does and does not absorb electrons, should be supplied to the defects. So far such suitable materials with proper structure and the method for providing such materials are not selected or established.

SUMMARY OF THE INVENTION

In a mask used for the reduction projection method by a highly accelerated electron beam, which the inventor of the present invention proposed, two conditions are required. One is that the electron scattering portion scatters the electrons in an appropriate manner, and another is that the electron scattering portion does not absorb the electrons and that heat is not generated significantly due to irradiation of the electron beams. It is required that the electron scattering property of the substance formed selectively in the clear defect portion be the same as in other portions of the mask when electron beam reduction projection lithography is applied. Further, it is desirable that the irradiated electron beams are accelerated to more than 50 kV in order to suppress electron absorption into the electron scattering substance of the mask. The following explains the effect of absorption of electrons into the electron scattering substance of the mask. When electrons have been absorbed in the membrane, heat is generated in the portion of the membrane according to the absorption volume and the thermal conductivity. Thermal expansion is caused in that portion of the membrane, and, as a result, the pattern size is altered. For example, it is required that the allowable width of pattern fluctuation should be less than 12 nm for 0.10 $\mu$m mode processing equivalent to 16 G-bit DRAM, for example, and the temperature-rise range was less than 0.1° C. in the case where the mask material is, for example, a single silicon crystal.

As a material satisfying these conditions, a material including carbon and a material including silicon, or similar, may be used. However, since the electron scattering property of the material including carbon is somewhat deteriorated, the material including silicon is considered especially preferred. Specifically, materials such as silicon, where a boron or phosphorus is doped in an appropriate manner, or a silicon nitride, or silicon carbide are preferable. Thus, it is necessary to find an inert gas, which has superior processing characteristics relative to these mask materials.

The present invention has been made in view of these points, and it is an object thereof to provide a method to modify, or repair a mask with high scattering and low absorption.

In order to solve the above-described problems according to the first embodiment of the present invention, a method to modify a defect caused at the time of manufacturing a mask, having a pattern exposure portion comprising an electron beam scattering material, which is used when a reduction projection exposure image is projected onto a substrate to be projected, is proposed.

An ion entered into an electron beam scattering material for the purpose of modifying an opaque defect pattern is obtained by sputtering of scattering material atoms or molecules, or the cluster. During the sputtering, some of the atoms, molecules or cluster are gasified, while some are scattered in the molten state, proportional to the ion energy applied. Those, which were scattered in the molten state, are deposited in the vicinity of the etching portion, and those, which were gasified, are accumulated in the vicinity of a processing portion and might be deposited again. This phenomenon is called re-accretion formation, or re-deposition. As a result of diligent research done by inventor of the present invention, it was confirmed that this re-accretion formation can be suppressed by a gas-assist etching method, and further, that correction of an opaque defect pattern is possible when utilized in the modification of pattern defects in EBPS-use scattering stencil type mask. Moreover, the gas-assist etching method is a publicly known processing method, and for instance, is introduced as a review in Jpn J. Apply. Phys. Vol. 33 (1994) pp. 7094–7098 by L. R. Harriott.

Though the gas-assisted etching for a single crystal silicon or amorphous silicon is known, and the reactive gas is of course disclosed in the prior art, these types of gases or conditions are not utilized directly in the material for scattering stencil type mask of the reduction projection exposure method using the high acceleration electron beam of the present invention. This is because said scattering stencil type masks require a finest processing resolution of 0.4 $\mu$m and a CD accuracy of 0.013 $\mu$m or less.

In the above description, use of 100 nm-lithography was supposed. However, the exposure method of the present invention can provide the lithography process with up to 70 nm and 50 nm. Thus, as a natural consequence, the minimum processing resolution on the mask is required to be 0.28 $\mu$m and 0.20 $\mu$m and, thus, a CD accuracy should be less than 0.010 $\mu$m. For the above reasons, it is not known whether or not the gas-assisted etching method utilizing the above-described gas can be applied to modify the pattern defects of a scattering stencil type mask for use with the EBPS, requiring a processing resolution of 0.4–0.2 μm.

As a result of further research, the inventor of the present invention has found that, by supplying a corrosive gas at the time of gas-assisted etching to the vicinity of a processing portion against a substrate to be processed under an appropriate condition, a processing with a resolution of 0.4 μm can be achieved. The inventor also found that applying this to modification of an opaque defect pattern of a scattering stencil type mask is very effective. Namely, as a gas to be supplied to the vicinity of processing portion by the method of gas-assisted etching, a type of gas, which is corrosive by adhering to an electron scattering material membrane on the mask, is preferable The method to modify the scattering stencil type mask is characterized in that a charged particle beam is irradiated to said defect while a gas comprising at least a compound material including a halogen is being supplied, so as to eliminate said defect. By using this method, a high process resolution can be obtained. A high quality scattering stencil type mask for use with electron beam reduction projection system can therefore be produced.

In the method of repairing the scattering stencil type mask, it is desirable that said gas is the one that operates as an etching agent for silicon. Moreover, it is desirable that said gas includes one of the members of the following group: iodine, chlorine, xenon fluoride, carbon tetrachloride group, such as $CCl_4$ and $C_2Cl_4$, carbon trichloride group such as $CHCl_3$, carbon tetrafluoride group, such as $CF_4$, or carbon trifluoride group such as $CHF_3$. It is also desirable that said gas is supplied with a flow rate thereof being adjusted after having been diluted by an inert gas.

In another embodiment of the present invention, a method to repair a defect, which has been made when a mask is used for projecting an image onto a wafer by a reduction projection exposure, is proposed. The repair method forms a membrane in a defective portion composed of material, the main element of which is silicon or carbon, comprising substances containing at least one atom of nonmetal Vb group atoms and semiconductor atoms except silicon, nonmetal atom, and metal atom. Thus, it is possible to form a repaired membrane in which the electron scattering property is high and the absorption of the electron beam is comparatively low. Further, in a repair method of the above-described mask, it is desirable that the membrane enables forward scattering of an electron beam greater than 10 mrad. Thus, it may be verified that the membrane has the electron scattering property. Further, it is desirable that the number of electrons which are forward-scattered within an electron beam irradiation angle range of 10 mrad is less than 1.5% of a total number of irradiated electrons when an electron beam is irradiated to the membrane. It is desirable that the composition quantity ratio for containing at least one atom of the nonmetal Vb group atoms and the semiconductor atoms except silicon, the nonmetal atom, and the metal atom in the substance is less than 92% of all atoms. In this repair method, it is also desirable that the membrane includes phosphorous, and the composition quantity ratio of phosphorous is less than 92% of the total number if atoms. Further, it is desirable that the membrane includes titanium, and the composition quantity ratio of titanium is less than 73% of all atoms. Moreover, it is desirable that the membrane includes gold, and the composition quantity ratio of gold is less than 20% of all atoms. Still further, it is desirable that the membrane includes platinum, and the composition quantity ratio of platinum is less than 15% of all atoms.

The membrane may also be created by supplying a mixture of substances to the defective portion by mixing plural gasified substances comprising the electron beam scattering substances at a predetermined mixture ratio and using a focused ion beam, an electron beam, or an infinitesimal plasma for exposure. According to the above described composition, plural materials comprising electron beam scattering materials are mixed at a predetermined mixture rate; the mixture of plural materials is supplied to the defective portion, and the membrane is selectively formed in the defective portion by arbitrarily selecting one exposure source of a focused ion beam, an electron beam, or an infinitesimal plasma. Using this method, the electron scattering property is adjusted. Thus, a mask having high electron scattering property and low electron beam absorption may be obtained.

As explained above, a FIB-Induced Deposition method is regarded as the most likely selective membrane forming method for clear defect repair. The density of the selective deposition membrane the main element of which is carbon or silicon is, however, lower than the density of a reticle bulk (single silicon crystal), thus the electron scattering property is significantly lower than that of the electron scattering material of the reticle. Under these circumstances, it is necessary to obtain a membrane for a mask with a high electron scattering property and comparatively low electron absorption. Another embodiment of the present invention provides a method by which to repair a defect that has been made when a mask has been used to project a reduction exposure image onto a wafer in which a pattern projection portion composed of a void in membrane which scatters electrons has been included. The method includes a step of forming a membrane composed of a material, a main element of which is carbon or silicon, in the defective portion, and a step of forming a repair reinforcement layer on the membrane. According to this embodiment, a membrane composed primarily of carbon or silicon suppresses the electron absorption, and the repair reinforcement layer reinforces electron beam scattering. Thus, a mask with a high electron beam scattering property and low absorption of the electron beam may be produced. It is preferable that the repair reinforcement layer is composed of substances containing semiconductor atoms (except silicon), non-metal atoms, or metal atoms.

Further, the present invention provides a structure by which to repair a defect that has been made when a mask has been used to transfer a reduction projection exposure image to a wafer having a void, or opening in electron beam scattering substance for a pattern projection portion; and a method by which to repair a scattering stencil type mask including a membrane formed in the defective portion and composed of a substance, the main element of which is carbon or silicon.

The repair membrane is a layered structure, layer upon layer, a repair reinforcement layer being composed of substances containing semiconductor atoms (except silicon), nonmetal atoms, or metal atoms and formed at a suitable thickness on the membrane, the main element of which is carbon or silicon. The thickness of the membrane can be set freely, in order to minimize the mean free path of the electrons. If the elements, such as semiconductor except silicon, non-metal atoms, or metal atoms contained therein are different, the membrane conditions, such as the optimum thickness, changes. Further, when the electron scattering property of the membrane, the main element of which is silicon or carbon, is different, the optimum atom composition ratio of the layer containing at least the above described atoms is different. The metal atoms are mostly from organic metal material as a material source. In this case, carbon or hydrogen is also contained to a degree in addition to metal.

DETAILED DESCRIPTION OF THE INVENTION

The preferred embodiments of the present invention are now described with reference to the accompanying drawings. Though the present invention will be described in detail by means of embodiments, the present invention is not limited by these examples.

First Embodiment

Figure 1:
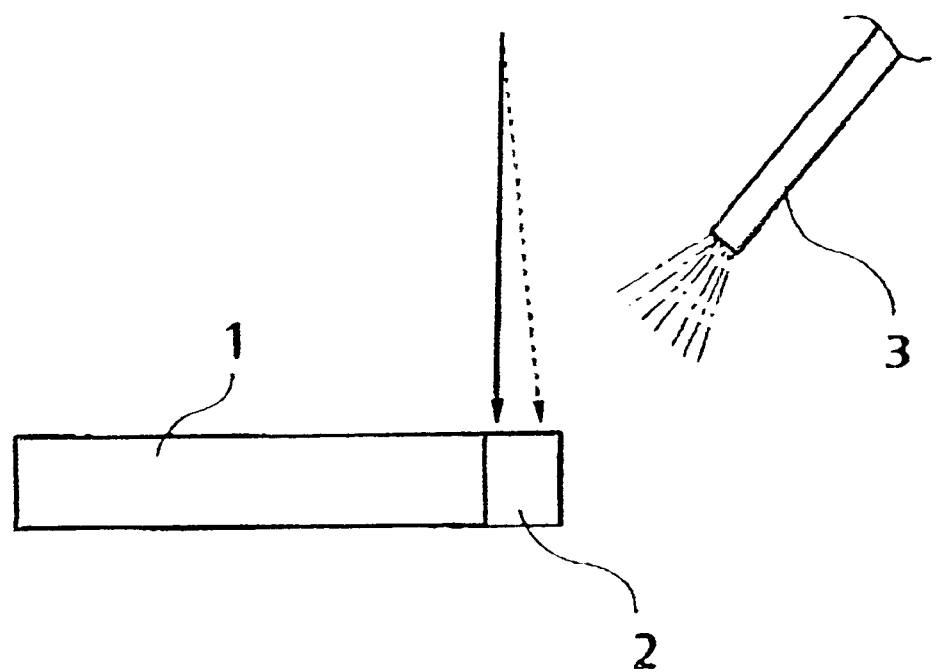
FIG. 1 is a schematic diagram to describe a selective gas-assist etching method according to the first embodiment of the present invention.
Figure 2:
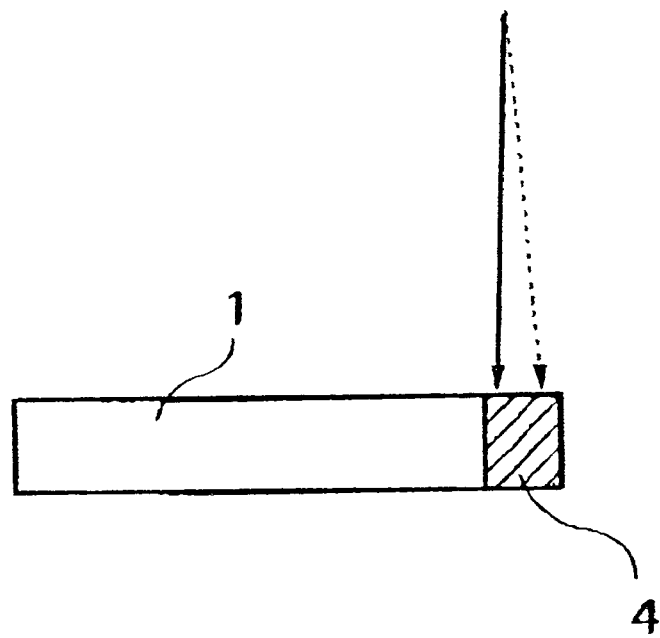
FIG. 2 is a schematic diagram to describe a selective milling etching method with a focused ion beam irradiating to a opaque defect of a mask according to the first embodiment of the present invention.

FIG. 1 and FIG. 2 are diagrams showing the processes utilized in the first embodiment of the present invention. FIG. 1 shows a case where the gas-assisted etching is performed such that the corrosive gas 3 is irradiated to the opaque defect 2 of the mask 1. FIG. 2 shows a milling process where the focused ion beam is irradiated to an opaque defect 4 of a mask 1. In FIG. 1, the corrosive gas is being supplied at an appropriate level thereof to the vicinity of the mask.

For example, an electron scattering material membrane of the mask is made of silicon with boron or phosphorous doped at the appropriate amount of 1E20/mol, a silicon nitride compound or a silicon carbide compound. In gas-assist etching method utilizing such type of gas, it is preferable that gases whose processing characteristics, such as the processing resolution of submicron processing and the processing shape, are superior. It is also preferable that the reactive gas at least comprises an appropriate amount of a compound including halogen. For example, there are available etching agents for silicon and so forth. Especially, iodine, chlorine, xenon fluoride, carbon tetrachloride group such as $CCl_4$ and $C_2Cl_4$, carbon trichloride group such as $CH_3CHCl_3$, carbon tetrafluoride group such as $CF_4$ and carbon trichloride group such as $CHCl_3$ have superior processing characteristics, so that the formation of the re-accretion can be significantly suppressed. In order to achieve a processing resolution capacity of submicron size by the gas-assisted etching using this gas, the shape of the focused ion beam shall be as narrow and sharp as possible. This processing resolution depends largely on the supply condition of the reactive gas. For example, suppose that the excessive amount of reactive gas was supplied. In this case, the corrosion might prevail upon a part other than a beam irradiation zone, and a desirable processing shape cannot be obtained when the gas-assist etching is performed on the opaque defect by irradiating the focused ion beam to the opaque defect. As a result, a processing resolution in the order of submicron cannot be effectively achieved.

Naturally, a flow rate-controlling meter in the order of 0.1 sccm is needed at the time of supplying the corrosive gas disclosed in the present invention to the vicinity of a portion to be processed. While this still presents a strong corrosiveness, it is desirable that said corrosive gas be diluted with one that is not reactive with said corrosive gas, such as nitrogen, argon and neon, which are inert gases. This way the ability to control thereof can be improved. It is appreciated that the flow rate control can be adjusted by adjusting the distance between the gas nozzle and the mask (gas supplying portion), or by changing the direction of the gas nozzle, and so forth. A focused ion beam, or electron beam can be used as the charged particle beam in the selective processing to modify an opaque defect pattern. The focused ion beam has the superior processing efficiency. The larger an ion's atomic number is, the higher the sputtering rate therefore becomes. In general, gallium ions, silicon ions, argon ions and the like are used. It is desirable that a charged particle beam for the selective processing is chosen in the light of the processing time, processing characteristics, and so on. In particular, since the processing characteristics of the ion optical system differ with the type of ion used, an ion optical system should be optimized according to the respective types of ion in order to obtain the sharpest beam.

In the first embodiment of the present invention a membrane blank with a thickness of 2 $\mu$m is produced with boron doped into an 8-inch p-type, 4–6 ohm silicon wafer. After that, a pattern of the mask is formed by reactive ion etching method. Thereafter, pattern accuracy such as the pattern position and pattern size, and pattern defects, such as defective wiring and poor connections are inspected. The inspection is carried out by a mask defect detection device equipped with an ion beam optical column and an electron beam optical column. As for a pattern defect, the defect is inspected in a manner where the image of the mask pattern, which was actually produced, is superimposed over the pattern design. Iodine ($I_2$) is used as the corrosive gas. However, since iodine is very corrosive to a boron-doped-silicon, the amount of gas supplied to the vicinity of a portion to be processed needs to be fine-tuned. Thus, iodine, which is already 10 times diluted by a nitrogen gas, is supplied to the vicinity of the sample. The amount supplied is controlled by a mass flow controller and is kept constant at 0.4 sccm. In this case, the distance between a gas introducing nozzle and the portion to be processed is controlled in increments of 0.1 mm. While the diluted iodine is being supplied to the vicinity of the portion to be processed, the focused ion beam is selectively irradiated to the opaque defect so as to remove the opaque defect. The focused ion beam condition is that a beam current rate of 12 pA accelerated to 30 kV and selectively irradiated. The pattern size of the opaque defect is about 0.5×0.4 μm, and the processing for this opaque defect takes approximately three minutes. After the mask pattern has been repaired, the pattern is inspected again. As a result, it was confirmed that all the patterns were repaired within allowed values. In a similar inspection performed after the production of a mask, after confirming that all pattern defects have been repaired, lithography was performed where the above-described mask was set up in an electron beam lithography device. The electron beam was accelerated to 100 kV and the beam current rate was set to approximately 50 pA. The lithography was performed on an electron beam compatible resist ZEP 520, located on a 4-inch wafer, whose thickness is approximately 0.5 μm. After the mask pattern was transferred and then development-processed, the resist image was evaluated by the scanning electron microscope. As a result, it was discovered that the repaired portion of the pattern forms a desirable projected image in a similar manner as in the non-repaired portions. Moreover, when the pattern size was measured by a measurement SEM, it was confirmed that all the patterns exhibited 10 nm at 3σ against the design value, thereby satisfying the standards.

Second Embodiment

According to the second embodiment of the present invention, in order to correct a clear defect, a material for membrane is selectively accumulated on the defective portion by a charged particle beam, such as a focused ion beam, an electron beam, and so forth, being irradiated to a clear defect portion to be repaired. In addition, a precursor material substance is supplied at a suitable concentration to the close vicinity of the defective portion of an electron beam scatterer. In this method, a FIB-induced deposition method, an EB-induced deposition method, or infinitesimal plasma CVD method can be applied for all practical purposes.

The material substance supplied to the defective portion of the electron beam scatterer is limited according to the composition and properties of the membrane to be formed. For example, when it is required to form a conductive membrane, it is no problem to use an organic compound containing a requested metal atom as the material substance. To give an actual example, if the membrane forming material requires wolfram to be the main element, hexacarbonyltungusten $(W(CO)_6)$ is heated moderately until a predetermined pressure is obtained. This is then introduced to the close vicinity of a specimen placed in a vacuum chamber, and the electron beam or conversing ion beam, etc. is irradiated while scanning the portion on which it is required to form the membrane. Thus, membrane-forming material the main elements of which are carbon and tungsten is selectively accumulated only on the portion on which it is required to form the membrane. The composition of the membrane contains hydrogen and oxygen in addition to tungsten and carbon. Further, in case when the membrane is formed by the FIB-induced deposition method, ions that form the charged particle beam (gallium, for example) are contained to a degree.

As explained above, a mask for electron beam reduction projection lithography requires high electron scattering property and low electron beam absorption property. The smaller the atomic weight is, the higher the electron scattering property is. The higher the membrane density is, the higher the electron scattering property is. On the other hand, the greater the atomic weight is, the higher the electron beam absorption power is. The higher the membrane density is, the higher the electron beam absorption power is. Accordingly, the condition between the electron scattering property and the electron beam absorption is contrary to each other. Therefore, in order to satisfy this kind of condition, it is preferable that the membrane is formed from a material, the main element of which is silicon or carbon. It is, however, unavoidable that the membrane density of an obtainable membrane forming material is lower compared with the density of bulk (reticle material) even if the focused ion beam, the electron beam, or the infinitesimal plasma is used as an exposure source. For membrane formed in this condition, it is unavoidable that the electron scattering property becomes lower than the electron scattering property of bulk if the membrane density is low, even though the membrane is composed only of silicon, carbon, or a mixture thereof without containing impurities. This kind of membrane is not sufficient as an electron beam scatterer material.

Figure 3:
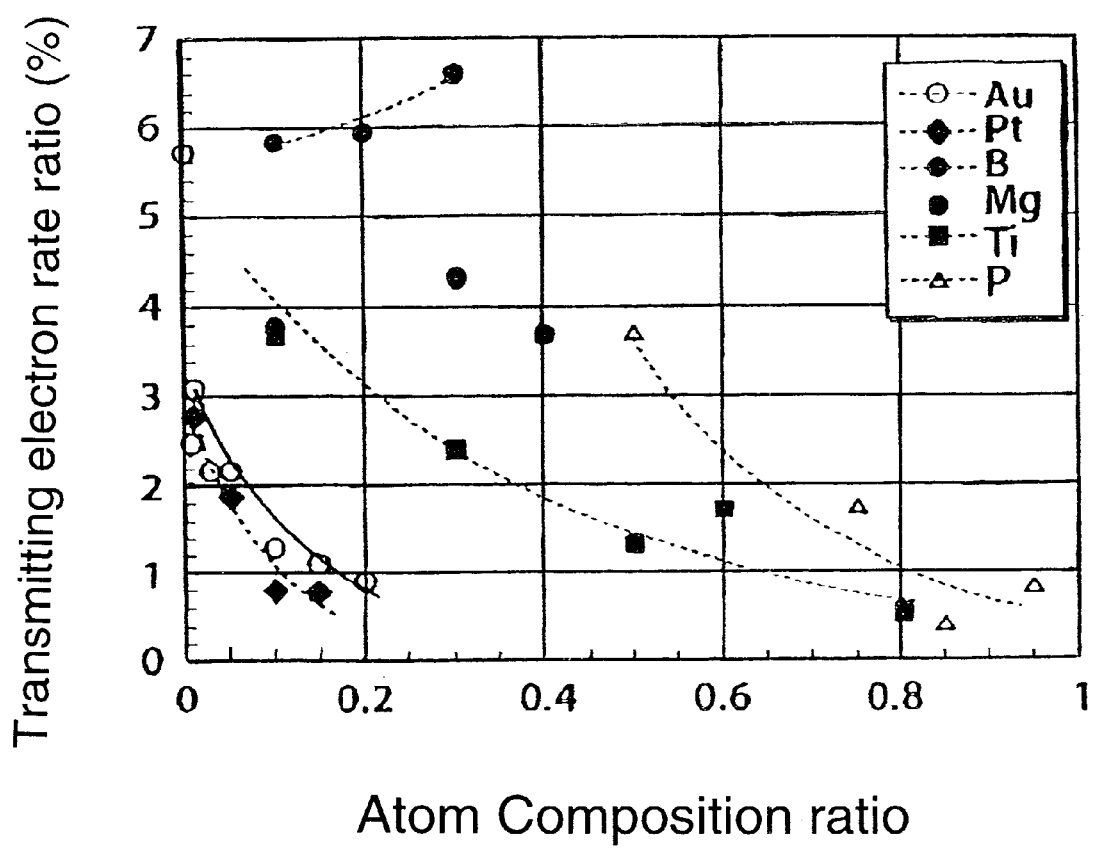
FIG. 3 shows a relationship between an atom composition ratio of nonmetal Vb group atoms and semiconductor atoms except silicon, a nonmetal atom, and a metal atom according to the second embodiment of the present invention, and its scattering property in a membrane the main element of which is silicon.
Figure 4:
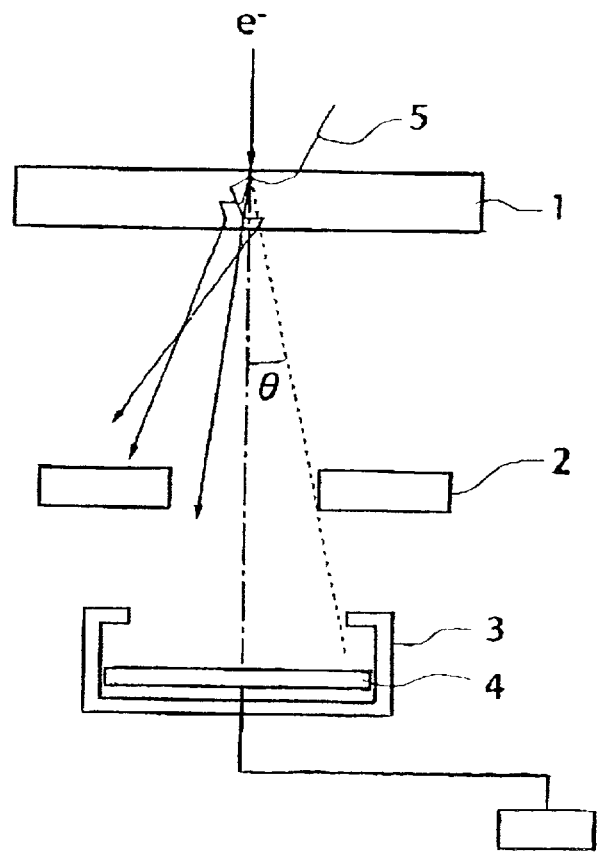
FIG. 4 is a sketch of a device used for scattering locus calculation.

In order to improve the electron scattering property even if the membrane density is low, a suitable quantity of nonmetal Vb group atoms and semiconductor atoms except silicon, nonmetal atom, and metal atom are mixed onto the membrane, the main element of which is silicon or carbon; or a membrane composed of material containing the nonmetal Vb group atoms and the semiconductor atoms (except silicon), nonmetal atom, and metal atom being deposited on or under selective membrane forming material composed of silicon, carbon, or a mixture thereof. Here, the best atom composition changes if the type of the nonmetal Vb group atoms and the semiconductor atoms except silicon, the nonmetal atom, and the metal atom changes. Further, it changes when the main element is silicon or carbon. The calculation result is shown in FIG. 3 as an example of a case of the nonmetal Vb group atoms and the semiconductor atoms except silicon, the nonmetal atom, and the metal atom being scattered into the membrane the main element of which is silicon. A scattering locus is calculated only for Ratherford scattering using the Monte Carlo method as the calculation model. This calculation assumes an opening angle of the aperture permeates the electrons with of the scattering angle from a lower surface of an electron scattering layer within a 10 mrad range, and shields the electrons with a scattering angle greater than that. Here, the following expression (1) is used for the scattering cross-section of Ratherford scattering. Moreover, a sketch of a model device used for this calculation is shown in FIG. 4. In FIG. 4, a scattering electron contrast-aperture 2 is located under a specimen 1 and a Faraday cup 3 is located under the scattering electron contrast-aperture 2. Here, θ means an opening angle to the aperture and a reference number 5 means the scattering locus of the electron:

$$(d\sigma/d\Omega)=(e^4z^2/4m^2v^4)*(1/[\sin^2(\theta/2)+\sin^2(\theta_0/2)]^2) \quad (1)$$

Although the performance of the electron scatterer may be defined as the electron scattering property, it is required for an electron beam reduction projection exposure method of the present invention that contrast be greater than 50. Contrast may be defined as the ratio of a total number of irradiated electrons to a number of electrons scattered and permeated within the above mentioned 10 mrad. According to the present invention, it is required that the electron scattering property of the repair membrane for the condition described above be less than 1.6%. According to this calculation, the number of electrons scattered within 10 mrad is calculated as less than 1% (contrast=99) of the number of all irradiated electrons.

FIG. 3 shows that a lateral axis is the composition ratio of each additional atom in a silicon membrane and a vertical axis is the quantity ratio of electrons scattered or permeated within 10 mrad indicated by a percentage. According to this result, it is shown that there is a tendency for the composition ratio to increase if light elements such as phosphorus, magnesium, and boron are contained in the membrane, and the larger the atom composition ratio is, the lower the electron scattering property is for atoms, especially for those the atomic weights of which are smaller than that of silicon. Further, it is found that the more heavy atoms the membrane contains, the smaller the composition ratio is. However, careful attention should be paid not to add an excessive amount of elements because as the absorption quantity of electrons increases, it may result in generation of heat. On the other hand, the electron scattering property of these elements also increases when excessive elements are added.

Thus, the quantity ratio of the transmitted, or permitted electrons is preferably less than 1% and greater than 0.8% in the above described model for the composition ratio of atoms when the membrane is formed on another membrane, or scattering is made into a membrane composed mainly of silicon or carbon. According to the consideration of each composition ratio based on this guideline, it is concluded that the composition ratio of atoms should be less than 9.2% if the nonmetal Vb group atoms and the semiconductor atoms except silicon, the nonmetal atom, and the metal atom are formed on a membrane or mixed into a membrane composed mainly of silicon or carbon.

It is considered to be good if the composition ratio of atoms is less than 92% for the case of phosphorus, less than 73% for the case of titanium, and less than 20% for the case of gold, for example. Further, it is good that the composition ratio of atoms is less than 15% for the case of platinum, for example.

The present invention discloses a maximum addition quantity when the nonmetal Vb group atoms and the semiconductor atoms except silicon, the nonmetal atom, and the metal atom are added into silicon or carbon. The carbon or hydrogen, etc. is contained in the metal to a degree because an organic metal material is treated as precursor material of the metal atom and thus the above mentioned composition ratio of atoms is effective in this case.

It is considered that the scattering method of the nonmetal Vb group atoms and the semiconductor atoms except silicon, the nonmetal atom, and the metal atom comprises supplying a precursor gas capable of forming the membrane by selecting all of these atoms at the same time, or by mixing them on the specimen. It is undoubtedly no problem that a different membrane containing the nonmetal Vb group atoms and the semiconductor atoms except silicon, the nonmetal atom, and the metal atom can be formed on another membrane formed of silicon, carbon, or both. Further, it is desirable that the electron beam absorption be low for the mask of the present invention. It is also desirable that the material and the repair composition of the membrane be controlled in order for the electron absorption to be suppressed because the greater the atom weight or the membrane density is, the greater is the electron beam absorption.

[Example for Second Preferred Embodiment]

Figure 5:
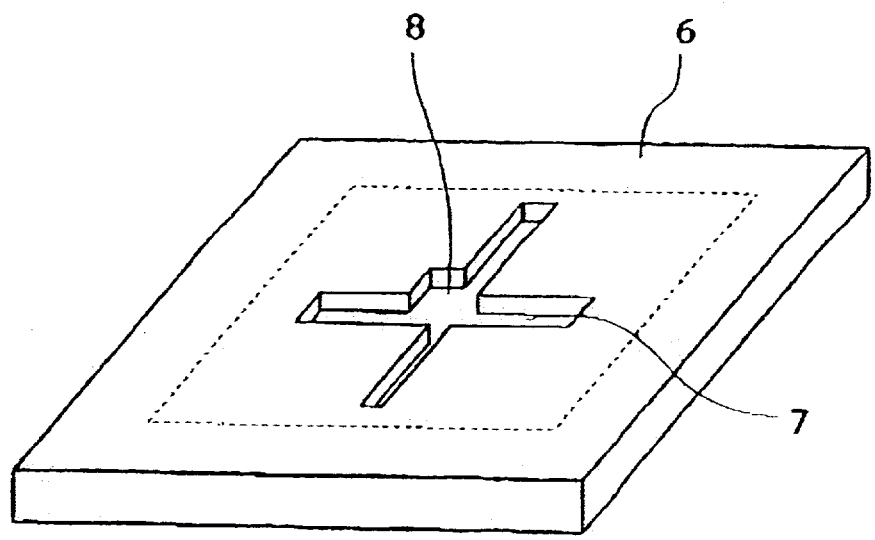
FIGS. 5 and 6 show a defect pattern portion of a scattering stencil type mask of the present invention.

First of all, boron as a doping material has been doped to a depth of approximately 2 $\mu$m by a thermal diffusion method on a p-type 8-inch silicon wafer, the resistance of which is 4 to 6 ohms. Then the membrane has been formed by a wet etching method using a potassium hydroxide solution. A reticle pattern has been formed by a reactive ion etching method applying a photolithography method on the membrane, then a scattering stencil type mask has been made. Then, pattern defect inspection has been executed for disconnection and wrong connection, and pattern precision inspection has been executed for pattern size and pattern location for this mask pattern. The inspection has been executed using a mask defect detection device equipped with an ion beam optical column and an electron beam optical column. Further, a defect portion has been inspected for the pattern defect by overlapping a mask pattern image on a pattern plan. As a result, as shown in FIG. 5, a cross shape defect portion, called a clear defect 8, has been detected in the mask pattern 7 of the mask 6. The size of this clear defect portion is approximately 0.24 $\mu$m$^2$.

Thus, dichlorosilane as the main material and $C_5H_5Pt(CH_3)_3$ as the addition material have been supplied to the close vicinity of the mask pattern 7 using an independent gas introducing system, and the focused ion beam with a gallium ion has been irradiated to the clear defect pattern portion. For each quantity of gas flow, 0.3 sccm of $C_5H_5Pt(CH_3)_3$ has been supplied for 5 sccm of dichlorosilane. A focused ion beam with accelerating voltage 15 kV and beam current 350 pA was used for exposure. Moreover, a focused ion beam scan domain was 0.35 $\mu$m$^2$ that was larger than the clear defect pattern portion. As a result, the pattern repair membrane of 0.3 $\mu$m$^2$ has been formed in the region of the clear defect pattern. In this condition, when the precision of the pattern size and the pattern location have been measured, it has been confirmed that a surplus membrane has been formed, and the pattern repair has been finished by milling by the focused ion beam irradiated to the surplus membrane. As shown in FIG. 4, in order to evaluate constantly the electron scattering property of the clear defect repair portion, the Faraday cup 3 has been arranged under the specimen 1 by TEM the beam diameter of which has been several nm. It then became possible to measure the quantity of permeation electric current when the electron beam was irradiated to the predetermined portion. It has become possible to measure the electrons, the semi-opening angle, or inclination of the opening of which was within 10 mrad by the accelerating voltage of the electron beam of 100 kV and an aperture 2 arranged above the Faraday cup 3. When the ion beam has been irradiated to the clear defect repair portion formed under the above described condition, the permeation electric current has been less than 1 pA with the beam current of 126 pA. When this result has been calculated by a scattering simulation using the Monte Carlo method under the condition that the permeation electric current was 0.8 pA, the ratio of platinum contained has been equal to approximately 16% for the ratio of the atomic weight.

After verifying by the same inspection as done after the mask was formed that all of the defective portions of the pattern have been repaired, the lithography was performed by setting this mask in the electron beam reduction projection exposure apparatus. To give an actual example, the electron beam has been accelerated with 100 kV and the beam current has been about 50 $\mu$A. Further, lithography has been performed to an electron beam resist (ZEP520) of 0.5 $\mu$m thickness on the 4 inch wafer. Then, after the development operation has been performed after pattern transfer, a resist image has been evaluated by a scanning electron microscope. As a result, it has been verified that a good projection image has been formed of the repaired portions of the pattern in the same way as of the non-repaired parts. Moreover, when the pattern size has been measured by a wavelength SEM, all patterns have been within the error range less than 10 nm to design value. Thus it has been verified that standard requirements have been fully satisfied.

THIRD EMBODIMENT

It was discovered by the inventor that it is possible to improve the electron scattering property by doping metal atoms in the membrane, the main element of which is silicon or carbon with a predetermined composition ratio. The best composition ratio of metal atoms differs with the kind of metal atoms. Further, the best composition ratio of metal atoms when the main element of the membrane is silicon is different from the best composition ratio of metal atoms when the main element of the membrane is carbon. The third embodiment of the present invention discloses how precursor gas sources should be supplied to the close vicinity of the defect in the case where the membrane is formed selectively using these types of plural materials.

The reaction properties between respective materials should be, however, considered if plural materials are supplied to the close vicinity of the defect. The mixture ratio of plural material substances has to be controlled in order for the membrane to have the properties as described above.

First of all, it is preferable that each gas of plural precursor substances is individually gasified and supplied to the vicinity of the defect. Such as in the case when even one material substance from among plural gas substances has a high reactive property, and other gas substances can not be supplied to the vicinity of the defect for the reactive gas may create chemical bonds with other successively gasified material substances, or the membrane forming substance can be gasified and supplied but would not satisfy the necessary properties such as absorption of electrons and scattering of electrons. For example, if a membrane is formed using tetraethoxysilane $(Si(OC_2H_5)_4)$ as a silicon source and hexacarbonyltungsten $(W(CO_2)_2)$ as a metal material, tetraethoxysilane hydrolyzes is reacting to the moisture of the air and gelatinizes according to the circumstances by bonding itself to hexacarbonyltungsten or tetraethoxysilane. In this case, it becomes impossible to gasify and introduce the substance to the vicinity of the specimen. In such a case, each of the plural material substances are individually gasified and supplied to the close vicinity of the specimen respectively. Further, if each of the plural material substances or the mixture of them does not react with each other, the plural material substances are being mixed in advance, gasified as one, and then supplied to the vicinity of the defect.

When each substance is supplied to the close vicinity of the defect, the composition of the membrane may be controlled by controlling of each gas-supplied volume. It is not, however, possible that the mixing ratio of plural substances become the composition ratio of gas supplied to the close vicinity of the defect. This is because each vapor pressure is generally not the same when plural substances are supplied by being mixed and then gasified. It is preferable that the components of a mixture be gasified individually in order for the gasified molecular composition ratio to be a predetermined ratio, and for the separate gasified molecular elements to be mixed until a predetermined concentration is attained. It is preferable that the gas concentration is suitably determined based on the consideration that the gas concentration is influenced significantly by the gas pressure of each of the substances and the gasifying temperature. Further, if a charged particle beam, such as a focused ion beam and an electron beam is irradiated under the condition that plural precursor substances are provided to the close vicinity of the portion of the reticle where the selective membrane is to be formed by this method, the irradiated portion is exposed and then the selective membrane is formed. It is generally well-known that the incident energy highly contributes to the membrane properties, so the membrane density is high, and the membrane forming speed is high when a focused ion beam is used, compared to the use of an electron beam.

Further, it is preferable that the focused ion beam has a greater atomic weight. The required high energy is more than about 30 kV and the beam current value is more than 50 pA if the practical selective membrane is formed by the electron beam entering at a tilted angle. When considering productivity, it is preferable that the focused ion beam is used. Considering these facts, it is preferable to choose silicon or carbon as the main element of the membrane. For example, an organosilane compound may be used as a precursor gas so as to be supplied to the close vicinity of the clear defect portion for the purpose of forming a selective membrane of silane compounds. More specifically, tetramethylsilane, trimethylethylsilane, dimethyldiethylsilane, etc. may be considered.

Further, a halosilane compound group, the hydrolyzable group of which is a halogen atom, a carboxysilane compound group, the hydrolyzable group of which is a carboxyl group, a ketooximesilane compound group, the hydrolyzable group of which is a ketooxime group, or an alkoxysilane compound group, the hydrolyzable group of which is an alkoxy group may be used. The alkoxysilane compound group is preferably used. Some actual examples include:

dimethyldimethoxysilane, dimethyldiethoxysilane, diethyldimethoxysilane, diethyldiethoxysilane, phenylmethyldimethoxysilane, phenylmethyldiethoxysilane, γ-chloropropylmethyldimethoxysilane, γ-chloropropylmethyldiethoxysilane, γ-methacryloxypropylmethyldimethoxysilane, γ-methacryloxypropylmethyldiethoxysilane, γ-mercaptopropylmethyldimethoxysilane, γ-mercaptopropylmethyldiethoxysilane, γ-aminopropylmethyldimethoxysilane, γ-aminopropylmethyldiethoxysilane, methylvinyldimethoxysilane, methylvinyldiethoxysilane, γ-glycidoxypropylmethyldimethoxysilane, γ-glycidoxypropylmethyldiethoxysilane, methyltrimethoxysilane, methyltriethoxysilane, methyltripropoxysilane, methyltributoxysilane, methyltris(2-methoxyethoxy)silane, ethyltrimethoxysilane, ethyltriethoxysilane, ethyltripropoxysilane, ethyltributoxysilane, ethyltris(2-methoxyethoxy)silane, propyltrimethoxysilane, propyltriethoxysilane, buthyltrimethoxysilane, buthyltriethoxysilane, hexyltrimethoxysilane, hexyltriethoxysilane, vinyltrimethoxysilane, vinyltriethoxysilane, vinyltris(2-methoxyethoxy) silane, phenyltrimethoxysilane, phenyltriethoxysilane, γ-chloropropyltrimethoxysilane, γ-chloropropyltriethoxysilane, 3,3,3-trifluoropropyltrimethoxysilane, 3,3,3-trifluoropropyltriethoxysilane, γ-methacryloxypropyltrimethoxysilane, γ-methacryloxypropyltriethoxysilane, γ-amininopropyltrimethoxysilane, γ-aminopropyltriethoxysilane, γ-mercaptopropyltrimethoxysilane, γ-mercaptopropyltriethoxysilane, chloromethyltrimethoxysilane, chloromethyltriethoxysilane, N-β-aminoethyl-γ-aminopropyltrimethoxysilane, N-β-aminoethyl-γ-aminopropyltriethoxysilane, γ-glycidoxypropyltrimethoxysilane, γ-glycidoxypropyltriethoxysilane, (3,4-epoxycyclohexylmethyl)trimethoxysilane, (3,4-epoxycyclohexylmethyl)triethoxysilane, (3,4- epoxycyclohexylethyl)trimethoxysilane, (3,4-epoxycyclohexylethyl)triethoxysilane, tetramethoxysilane, tetraethoxysilane, tetrapropoxysilane, tetrabutoxysilane, 1,1-bis(trimethoxysilyl)ethane, 1,1-bis(triethoxysilyl)ethane, 1,2-bis(trimethoxysilyl)ethane, 1,2-bis(triethoxysilyl)ethane, 1,3-bis(trimethoxysilyl)propane, 1,3-bis(triethoxysilyl)propane, 2,2-bis(trimethoxysilyl)propane, and 2,2-bis(triethoxysilyl)propane.

Further, when films of carbon compounds are selectively formed, a condensed polycyclichydrocarbon group and ortho- and peri- condensed polycyclichydrocarbon group having a benzene ring as a major structure therein, such as naphthalene, biphenylene, acenaphthylene, fluorene, phenalene, phenanthrene, anthracene, fluoranthene, acephenanthrylene, aceanthrylene, triphenylene, pyrene, chrysene, naphthacene, pleiadene, picene, perylene, pentaphene, pentacene are effective as the material gas. Further, styrene, HMDS (hexamethyldisilazane), HMCTS (hexamethylchlorotrisilane), MIBK (methyliributylketone), and IPA (isopropyl alcohol) and so forth can be used as carbon compounds for forming the membrane. As additional matter, metal compounds are preferable, examples of which include hexacarbonyltungsten ($W(CO)_6$), tungstenfluoride ($WF_6$), tungstenchloride ($WCl_6$), alkylaluminium group (($CH_3)_2AlH$, $(CH_3)_3Al$, $(i\text{-}_4H_9)_3Al$, $(CH_3)_2AlCl$, $(CH_3)_3NAlH_3$, etc.), $C_7H_7F_6O_2Au$, $Mo(CO_6)$, $Fe(CO)_4$, $(Cu(hfac))_2$, $Cr(C_6H_6)_2$, $C_6H_6Pt(CH_3)_3$, and so forth. The quantity and type of additional matter is decided by considering that the electron scattering property of the membrane forming substance must be high and the absorption rate of electrons is acceptable. Further, it goes without saying that metal compounds are stable and a safe substance with respect to safety, security and sanitation.

[Examples of the Third Embodiment]

Figure 7:
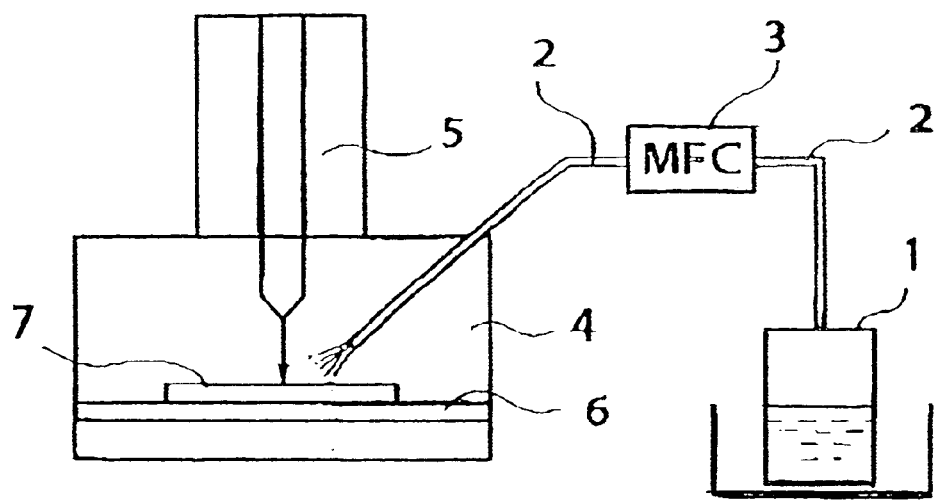
FIG. 7 is shown a schematic view showing an example of an ion beam apparatus equipped with a gas supply system that is used in the third embodiment of the present invention.
Figure 6:
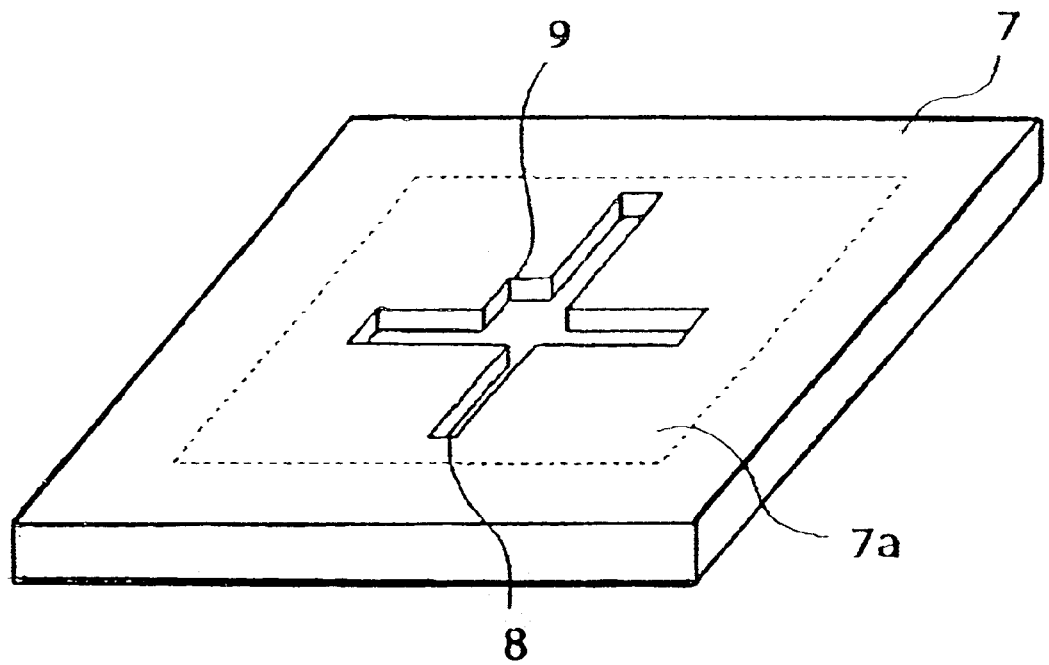

First of all, a membrane, the thickness of which is 1 to 3 $\mu$m is formed on a p-type 8-inch silicon wafer, the resistance of which is 4 to 6 ohms. A scattering stencil type mask is made with a mask pattern formed using a reactive ion etching method, such as a photolithography applied to the membrane. Then, inspections of the mask pattern for pattern defects, such as defective connections and discontinuous wiring, and pattern precision, such as pattern size and pattern position, are performed. The inspection is performed using a mask defect detection apparatus equipped with both an electron beam optical column and an ion beam optical column. Further, a defective portion is detected using a image of the mask pattern, which has been formed for all practical purpose, being superimposed on a pattern blueprint. As a result, as shown in FIG. 6, a clear defect pattern 9 has been detected on a mask pattern 8, having a cross shape formed on a membrane portion 7a of a reticle 7. Thus, selective membrane was formed by a focused ion beam made of gallium ions as an exposure source, used in the close vicinity of the clear defect pattern 9. Tetramethylsilane $C_5H_5Pt(CH_3)_3$ has been mixed and used as the material substance. Both of these two substances are fluid at room temperature and supplied to the close vicinity of defect after being mixed and gasified in the same container. This is possible since both of them do not easily react with each other or individually in the gas phase. FIG. 7 is a schematic diagram of the focused ion beam apparatus equipped with a gas supply system, one of the purposes of which is to repair a clear defect. The above mentioned two kinds of gasses become a uniform gas mixture by being introduced into a container 1 and well mixed by a machine. Then, the container 1 is sealed and decompressed to the same pressure as vacuum chamber 4. The gas mixture of container 1 is introduced into the vacuum chamber 4 through the pipe arrangement 2. The vacuum chamber 4 has been heated adequately by a hot plate, etc. so as to keep adequate vapor pressure of the mixture gas. Further, it is also necessary to heat similarly pipe arrangement 2 arranged in the close vicinity of the reticle 7 mounted on a mounting base 6 of the vacuum chamber 4. According to the preferred embodiment of the present invention, the container 1 and pipe arrangement 2 are heated to approximately 56° C. and 45 to 50° C., respectively. The volume of gas supplied to the close vicinity of a baseboard is controlled by this vapor pressure. Thus, the gas mixture is supplied from the container 1 to the vicinity of the mask 7 in the vacuum chamber 4 through the pipe arrangement 2. At this time, the volume of flow of the gas mixture is controlled by a mass flow controller (MFC) 3 installed in the pipe arrangement 2. Then, the focused ion beam is irradiated to the gas mixture supply region from a beam source 5 installed on the top of the vacuum chamber 4. For example, a focused ion beam composed of Ga ions is irradiated and scanned to the clear defect portion of the mask to which the mixture gas has been supplied. In this case, accelerating voltage is 30 kV and the beam current value is 400 pA, the dimension of the clear defect portion is approximately 0.15"–0.20", and it is required approximately 2 minutes in order to form a membrane in this region. After it is confirmed, using the same inspection as performed after the mask is formed, that all the defective pattern portions have been repaired, the lithography is applied by setting the mask on an electron beam projection exposure apparatus. To give an actual example, the electron beam is increased to 100 kV for acceleration, and beam current value is 20 $\mu$A. Further, the lithography is applied to a high definition sensitive posi-type electron beam photoconductor resist ZEP 520 (NIHON ZEON CO., LTD.) of approximately 0.3 $\mu$m thickness on a 4 inch wafer. When such a process is performed after coating the resist (pre-bake, development conditions) it is set as usual. Next, shape evaluation and measurement evaluation of the resist are performed by a measuring scanning type electron microscope. As a result, it should be verified that the repaired portion of the pattern has formed a good projection image similar to the non-repaired portion, and its line image has not changed. As a result of measurement evaluation, it should be verified that all the patterns have satisfied the error range of less than 10 nm compared to the blueprint data, and thus a standard requirement has been satisfactory fulfilled.

Figure 8:
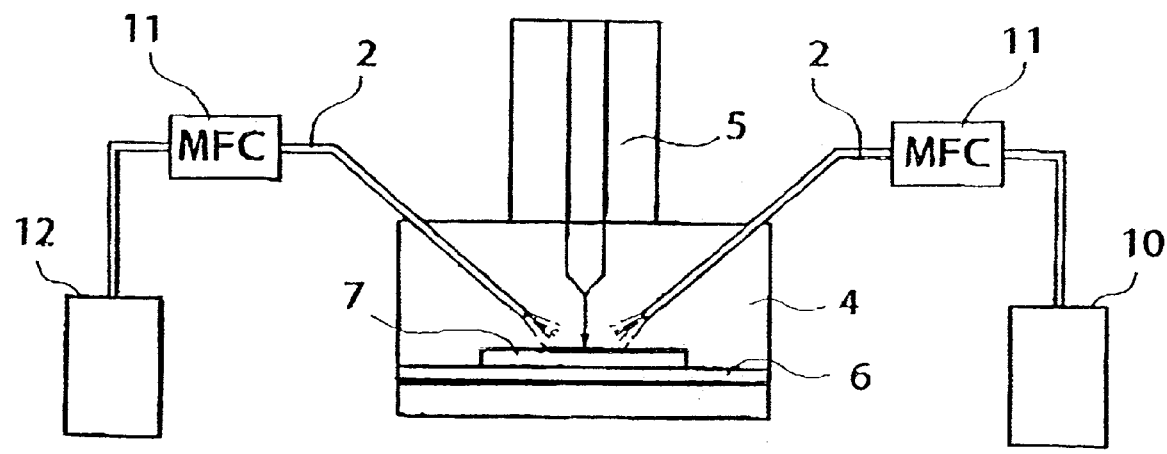
FIG. 8 is an illustration explaining another example of a focused ion beam unit equipped with a gas supply system that is used in the third embodiment of present invention.
Figure 9:
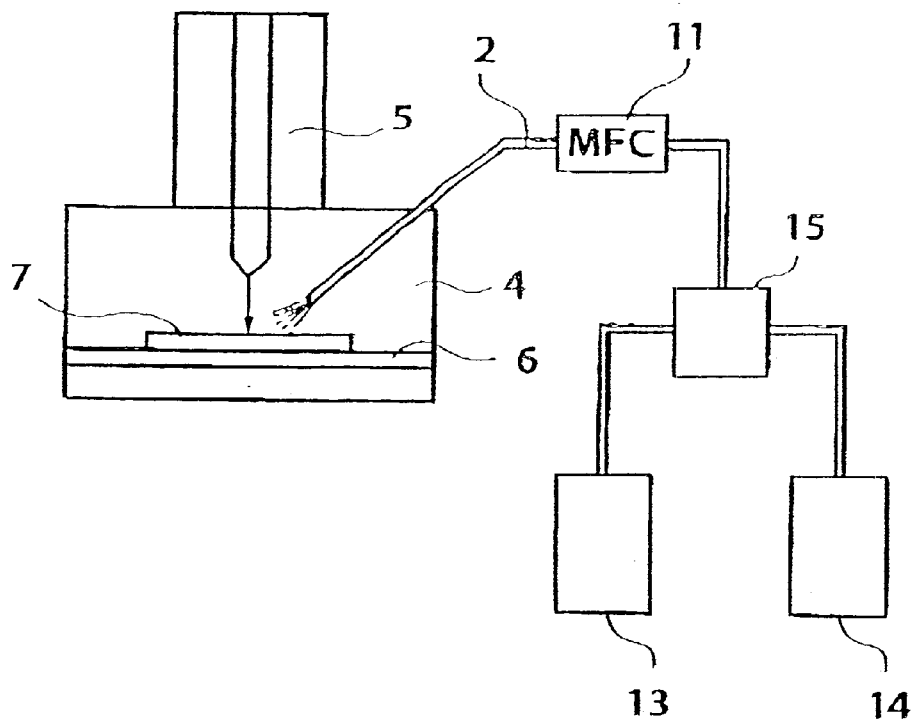
FIG. 9 is an illustration explaining yet another example of a focused ion beam unit equipped with a gas supply system that is used in the third embodiment of the present invention.

Although it is explained in this preferred embodiment that plural precursor gasses are mixed in advance and the gas mixture is supplied to the clear defective pattern portion, each substance might be supplied to the vicinity of the reticle 7 as shown in FIG. 8 by being gasified in each of containers 10 and 12. These are then flow-controlled by MFC 11 in the case where plural gas materials have a high reactivity and create a chemical bond with other material substances. In this way, precursor gasses are not supplied to the close vicinity of the defect by simply gasifying. In addition, it might be preferable that plural substances are supplied to the close vicinity of the reticle 7 as shown in FIG. 6 by being flow-controlled by MFC 11. In this way, the substances from containers 13 and 14 as shown in FIG. 9, are mixed in a mixing area 15 and the mixed substances are gasified in the mixing area 15 successively in the case where plural substances have not reacted with each other even if they have been mixed or are individual.

FORTH EMBODIMENT

According to the forth embodiment of the present invention, it is preferable that a membrane forming substance selectively coating the clear defect portion is a substance, the main element of which is carbon or silicon, or both, which may form a three-dimensional bond. A repair membrane is formed by this substance. A layer containing a suitable semiconductor atom except silicon, the non-metal atoms, and/or the metal atoms is formed on the upper layer if necessary, resulting in a structure of plural repair membrane layers. It is acceptable that the bottom layer is a layer, the main element of which is carbon or silicon, the middle layer is the above described metal containing layer, and the top layer is a layer containing other metals. Further, it is also acceptable that double layers, the main element of which is carbon or silicon, are deposited as bottom layers, and a layer containing metal is deposited thereon. Further, there is no limitation to the layer structure.

Considering the issue of performance and stability when the electrons are irradiated, it is preferable that these membrane forming substances are crystal substances, or substances having the structures equivalent to those of the membranes. Further it is also required that these membrane-forming substances have high density. For example, it is not necessarily true that all of silicon are bonded together in the case when the membrane, the main element of which is silicon has low density. If exposed to the air in this situation, the hydroxyl group is bonded thereto, and the membrane then becomes oxidized. Such a membrane property lowers conductivity when the electrons are irradiated, and charge-up might occur in an extreme case. Also, as shown above, when referring to a focused ion beam and electron beam as the projection beam, it is known in general that the focused ion beam has a high incidence energy, and contributes to the membrane high density and to the high membrane formation speed. The heavier the atomic weight of the ion is, the better is the focused ion beam. It is preferable that the beam current value is more than 10 pA and accelerating voltage is more than 5 kV. This shortens the free path of the electrons in order to obtain practical membrane forming speed when the electron beam is used as the exposure source. The voltage and current value are not limited to the above conditions. Also, it is desirable to use the focused ion beam when it is considered that the clear defect pattern repair and opaque defect pattern repair may be performed.

As material satisfying the requirements for the membrane forming substance, a substance, the main element of which is a silane compound or a carbon compound, may be used. For example, an organosilane compound is suitable for use as the precursor gas in the case of supplying to the close vicinity of the clear defect portion, in order to form a selective membrane based on the silane compound. Some actual examples include: tetramethoxysilane, trimethylethylsilane, and dimethyldiethylsilane. Further, a halosilane compound group the hydrolyzable group of which is a halogen atom, a carboxysilane compound group the hydrolyzable group of which is a carboxyl group, a ketooximesilane compound group the hydrolyzable group of which is a ketooxime group, or an alkoxysilane compound group the hydrolyzable group of which is an alkoxy group are capable of being used. The alkoxysilane compound group is preferably used. The actual examples are the same as in the third embodiment of the present invention.

Further, it goes without saying that arbitrary materials which can be supplied to the vacuum room by gasifying, and containing silicon like a trisilane group and a disilane group, such as silane, dichlorodisilane, dibromodisilane, hexacyclodisilane, are potentially suitable, and a substance used for forming a silicon Class CVD membrane is most effective.

Further, when a membrane is selectively formed, carbon compounds such as a polycyclic carbon hydride group of orthocondensation polycyclic and pericondensation polycyclic, a condensation polycyclic carbon hydride group such as pentacene, pentaphene, perylene, picene, pleiadene, naphthacene, chrysene, pyrene, triphenylene, aceanthrylene, acephenanthrylene, fluoranthene, anthracene, phenanthrene, phenalene, fluorene, acenaphthylene, biphenylene, and naphthalene the chief lattice of which is a benzene ring, are potentially suitable as the material gas.

It is preferable that the electron scattering repair layer, which comprises at least one layer formed on the repair membrane, is a substance, the electron scattering property of that is high. The membrane preferably has a heavy atomic weight or high density, and contains at least some semiconductor atoms except silicon, some non-metal atoms, or some metal atoms.

For the electron scattering repair layers, the main elements of which are metalloid compounds and metal compound, it is preferable to use hexacarbonyltungsten ($W(CO_6)$), tungstenfluoride ($WF_6$), tungstenchloride ($WCl_6$), alkylaluminium group (($CH_3)_2AlH$, $(CH_3)_3Al$, $(i-C_4H_9)_3Al$, $(CH_3)_2AlCl$, $(CH_3)_3NAlH_3$, etc.), $C_7H_7F_6O_2Au$, $Mo(CO_6)$, $Fe(CO)_5$, $Ni(CO)_4$, $Cu(hfac)_2$, $Cr(C_6H_6)_2$, $C_6H_6Pt(CH_3)_3$, etc. These substance may be used individually, or as a mono-layer by forming a mixture membrane using plural material substances supplied to the vicinity of the specimen. Further, individual independent membranes also may be formed. Needless to say, there is no limitation among those layer structures.

Further, it is preferable that atoms such as a non-metal Class Vb group, semiconductor Class IIIb and Vb groups, some non-metal atoms, some semiconductor atoms, and some metal atoms are scattered in the membrane when at least one layer is formed, and the scattering property and conductivity are controlled. This is defined as a primary condition of the pattern defect repair for the pattern the electron scattering property of which is high, the absorption volume of electrons of which is not large, and the thermal deformation of which is suppressed as much as possible when electron irradiation is performed. Further, it goes without saying that it is preferable for membrane forming substances such as carbon compounds, silicon compounds, and metal compounds to be stable and safe substances with regards to safety, security, and sanitation.

The forth preferred embodiment of the present invention is explained in detail hereinafter and the present invention is not limited to modes of embodiments of the present invention.

First of all, boron as a doping element is doped by a thermal diffusion method in a p-type 8-inch silicon wafer, the resistance of which is 4 to 6 ohms, to the doping depth is 2 $\mu$m. The membrane is then formed by wet etching method using hydroxide kalium aqueous solution. A mask pattern is formed on the membrane by reactive ion etching method.

Then, the inspection for pattern defects such as discontinuous wiring and defective connections, and pattern precision for pattern size and pattern position of the mask pattern is performed. The inspection is performed using a mask defect detection apparatus equipped with both an electron beam optical column and an ion beam optical column. Further, with regard to the pattern defect, a defective portion is detected by superimposing a shape image of the mask pattern that is formed for all practical purpose, on a pattern blueprint. As a result, a clear defect pattern 9, is detected on a mask pattern 8 having a cross shape formed in a mask 7, as shown in FIG. 6. The size of this defective portion is approximately 0.24 $\mu m^2$. Then, dichlorosilane as the main substance was supplied to the vicinity of the clear defect pattern 9 and the focused ion beam using a gallium ion beam as the exposure source was irradiated to the clear defect pattern portion. The flow volume of supplied gas in the chamber is set to provide the degree of vacuum within a chamber in which processing is executed to be greater than $1\times10^{-6}$ Pa and the focused ion beam is accelerated to 16 kV and a beam current of 350 pA.

As a result, a pattern repair membrane is formed in a region of 0.3 $\mu m^2$. In this condition, the pattern portion is recognized by the above described defective detection system. A suitably accelerated electron beam is irradiated to the vicinity of the portion, and the contrasts between the repaired portion and a normal mask portion on a spatial image of the mask projection plane are verified. At this time, it is verified that the scattering capacity of the mask portion is 40% of the normal pattern portion. Thus, a selective deposition membrane (repair reinforcement membrane), the main elements of which are carbon and tungsten is formed on the repair portion. Explained in the following part of the specification is an actual example where the membrane is formed.

In the same way as the above described dichlorosilane supply, hexacarbonyltungusten $(W(CO)_6)$ is supplied to the vicinity of the defect, and the membrane is then formed selectively in a 0.36 $\mu m$ region of the clear defect pattern portion. This is done irradiating and scanning a focused ion beam with accelerating voltage of 15 kV and beam current value of 350 pA. While forming the membrane, the contrast for each spatial image at the time when the electron beam is irradiated per one flame scan is measured and the membrane formation is terminated at the time when the contrast is equal to the normal pattern portion.

Figure 10:
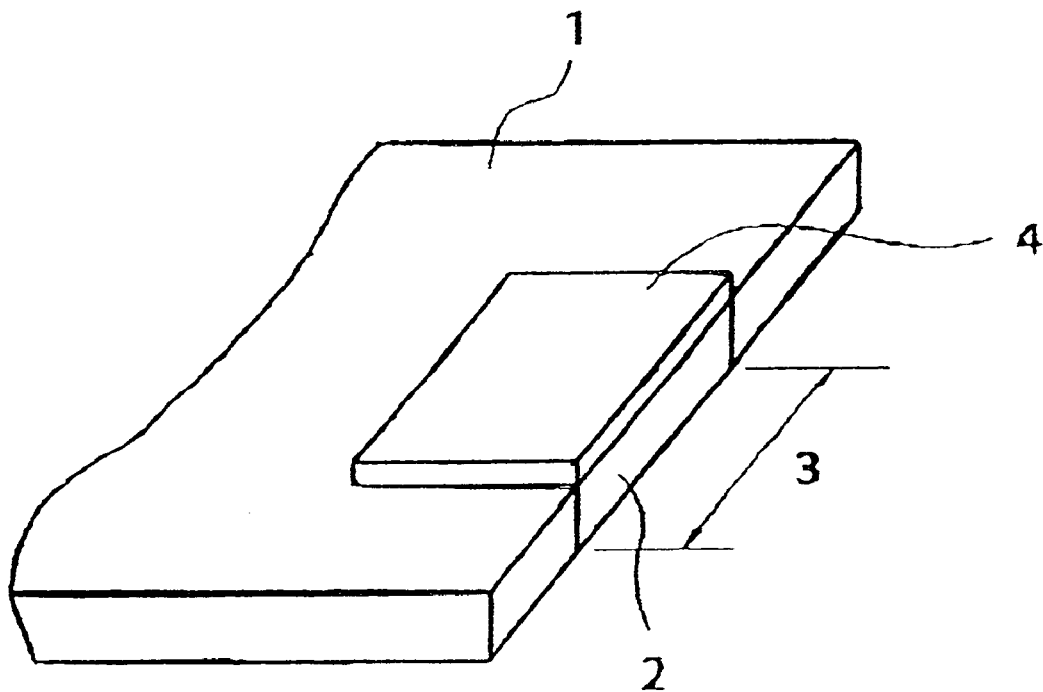
FIG. 10 is an illustration showing a repair portion of a mask repaired by the method of the forth embodiment of the present invention.

FIG. 10 shows the condition in which the membrane repair has been performed on the clear defect portion of the pattern. As shown in FIG. 10, a pattern repair membrane 2 is formed in a clear defect pattern 3 of a mask 1, and a repair membrane 4 is formed thereon. Following this, when the precision of the pattern size and pattern position are measured using the above described pattern defect detection system, it is verified that surplus membrane has been formed. The pattern repair is thus completed by irradiating the ion beam to the surplus portion and by milling. After it is confirmed that all of the defective portions of the pattern were repaired using the same inspection as performed after the mask is formed, lithography is applied with the mask set in an electron beam reduction projection exposure apparatus. The electron beam is accelerated to 100 kV and the beam current value is 20 $\mu A$. Further, lithography is applied to an electron beam photosensitive chemical amplification type resist (ZEP 520) of approximately 0.3 $\mu m$ thickness on a 4 inch wafer. Processes such as those when performed after coating the resist (prebake, development conditions) are set as usual. Then, a resist image is shape-evaluated using a scanning type electron microscope after development is performed following pattern transfer. As a result, it is verified that the pattern repair portion forms a good projection image in the same way as a non-repair portion. When the pattern size is measured using a measurement SEM, it is verified that all the patterns have satisfied the error range of less than 10 nm to the blueprint data, and thus a standard requirement has been satisfactory fulfilled.

The present invention can be applied to a variety of modified applications without being limited to preferred embodiments described above. For example, the material and dimensions of the preferred embodiments of the present invention may be changed and still remain within the scope of the present invention.

As explained above, according to the repair method of the present invention, a mask with high electron scattering property and low absorption of electrons can be produced.

What is claimed is:

1. A method of repairing a defect of a mask used in a projection lithography system having a pattern with high electron scattering property and low electron absorption, comprising following steps:

detecting a defect area in the pattern of manufactured mask;

supplying a gas comprising at least one compound material including halogen for use as an etching agent for silicon, said supplied gas including one of the following: iodine, chlorine, xenon fluoride, carbon tetrachloride group, carbon trichloride group, carbon tetrafluoride group, or carbon trifluoride group;

said supplied gas being first diluted by an inert gas and then supplied to the vicinity of the defect area with an adjusted flow rate; and irradiating a charged particle beam to said defect area.

2. A method of repairing a defect of a mask used in projection lithography system, having a pattern with high electron scattering property and low electron absorption, comprising following steps:

detecting a defective portion in the pattern when transferred to a wafer; and forming a membrane in the defective portion, the membrane composed of a material, main element of which is silicon or carbon, and including substances comprising at least one atom of nonmetal Vb group atoms and semiconductor atoms except silicon, a nonmetal atom and a metal atom.

3. A method of claim 2, wherein the membrane provides forward-scattering of electrons greater than 10 mrad when being illuminated by an electron beam.

4. A method of claim 2, wherein, when an electron beam is irradiated to the membrane, a number of electrons which are forward-scattered within electron beam irradiation angle range of 10 mrad is less than 1.5% of total number of irradiated electrons.

5. A method of claim 2, wherein the composition quantity ratio for containing at least one atom of the nonmetal Vb group atoms and the semiconductor atoms except silicon, the nonmetal atom, and the metal atom in the substances is less than 92% of all atoms.

6. A method of claim 5, wherein the membrane includes phosphorous and the composition quantity ratio of phosphorous atoms is less than 92% of all atoms.

7. A method of claim 5, wherein the membrane includes titanium and the composition quantity ratio of titanium atoms is less than 73% of all atoms.

8. A method of claim 5, wherein the membrane includes gold and the composition quantity ratio of gold atoms is less than 20% of all atoms.

9. A method of claim 5, wherein the membrane includes platinum and the composition quantity ratio of platinum atoms is less than 15% of all atoms.

10. A method of repairing a defective portion of a mask used in projection lithography system, having a pattern with high electron scattering property and low electron absorption, by forming a membrane selectively in a defective portion, the method comprising following steps:

detecting the defective portion;

supplying a plurality of gasified substances comprising electron beam scattering substances mixed at a predetermined mixture ratio to the vicinity of the defective portion individually; and irradiating the charged particle beam to the defective portion.

11. A method of claim 10, further comprising creating in the vicinity of the defective portion a precursor gas atmosphere with a predetermined density and mixture composition ratio.

12. A method of claim 10, wherein the substances comprising the electron beam scattering substances are mixed at a predetermined mixture ratio, and their mixture supplied to the vicinity of the defective portion.

13. A method of claim 12, wherein the mixture of substances is further gasified.

14. A method of claim 10, wherein the substances are mixed in advance in order to supply a mixture with a predetermined density and mixture composition ratio to the defective portion.

15. A method of claim 14, wherein the mixture of the substances is further gasified.

16. A method of repairing a defective portion of a mask used in projection lithography system, having a pattern with high electron scattering property and low electron absorption, by forming a membrane selectively in a defective portion, the method comprising following steps:

detecting the defective portion;

forming in the defective portion a membrane composed of a substance, main element of which is carbon or silicon: and forming a repair reinforcement layer on the membrane.

17. A method of claim 16, wherein the repair reinforcement layer is composed of substances containing semiconductor atoms except silicon, non-metal atoms, or metal atoms.

18. A structure for repairing a defective portion of a mask used in projection lithography system, the mask having a pattern with high electron scattering property and low electron absorption, the structure comprising a membrane formed in the defective portion and composed of a material, a main element of which is silicon or carbon, comprising substances containing at least one atom of nonmetal Vb group atoms and semiconductor atoms except silicon, a nonmetal atom, and a metal atom in a defect portion.

19. A structure for repairing a defective portion of a mask used in projection lithography system, the mask having a pattern with high electron scattering property and low electron absorption, the structure comprising;

a membrane formed in the defective portion and composed of a substance main element of which is carbon or silicon; and a repair reinforcement layer composed of substances containing semiconductor atoms except silicon, non-metal atoms, or metal atoms, and formed on the membrane.

* * * * *